(12) United States Patent
Essig et al.

(10) Patent No.: US 12,652,024 B2
(45) Date of Patent: Jun. 9, 2026

(54) SUPERCONDUCTING QUANTUM CIRCUIT FOR BOSONIC CODES WITH GALVANIC COUPLING

(71) Applicant: ALICE & BOB, Paris (FR)

(72) Inventors: Antoine Essig, Paris (FR); Raphaël Lescanne, Paris (FR); Sébastien Jezouin, Paris (FR)

(73) Assignee: ALICE & BOB, Paris (FR)

( * ) Notice: Subject to any disclaimer, the term of this patent is extended or adjusted under 35 U.S.C. 154(b) by 0 days.

(21) Appl. No.: 19/134,663

(22) PCT Filed: Dec. 6, 2023

(86) PCT No.: PCT/EP2023/084628
§ 371 (c)(1),
(2) Date: May 30, 2025

(87) PCT Pub. No.: WO2024/121273
PCT Pub. Date: Jun. 13, 2024

(65) Prior Publication Data
US 2026/0012157 A1     Jan. 8, 2026

(30) Foreign Application Priority Data

Dec. 7, 2022     (EP) .................................... 22306815

(51) Int. Cl.
*H03H 11/02*          (2006.01)
*G06N 10/40*          (2022.01)
(52) U.S. Cl.
CPC ............. *H03H 11/02* (2013.01); *G06N 10/40* (2022.01)
(58) Field of Classification Search
CPC ............................... H03H 11/02; G06N 10/40
See application file for complete search history.

(56) References Cited

U.S. PATENT DOCUMENTS

| | | | | | |
|---|---|---|---|---|---|
| 11,321,627 | B1 * | 5/2022 | Arriola | ................. | H03K 17/92 |
| 11,580,436 | B2 * | 2/2023 | Chamberland | ........ | H04B 10/00 |

(Continued)

FOREIGN PATENT DOCUMENTS

WO          2022103666 A1     5/2022

OTHER PUBLICATIONS

Leghtas et al., Science 347, 853 (2015) "Confining the state of light to a quantum manifold by engineered two-photon loss" (5 pages).

(Continued)

*Primary Examiner* — Sibin Chen
(74) *Attorney, Agent, or Firm* — BCF LLP

(57)          ABSTRACT

A non-linear superconducting quantum circuit comprising at least one resonant portion and an asymmetrical threaded superconducting quantum interference device connected to said at least one resonant portion galvanically, said non-linear superconducting circuit having a first mode with a first resonant frequency and a second mode with a second resonant frequency, the ratio between said first resonant frequency and said second resonant frequency being different from ½, said at least one resonant portion being configured with inductance and capacitance values of its symbolic representation which induce with said asymmetrical threaded superconducting quantum interference device said first mode and said second mode such that, said non-linear superconducting quantum circuit has zero-point fluctuations of the superconducting phase across the asymmetrical threaded superconducting quantum interference device for the first mode and the second mode which are superior or equal to 0.05 rad.

15 Claims, 8 Drawing Sheets

(56) References Cited

U.S. PATENT DOCUMENTS

2021/0234086 A1* 7/2021 Lescanne ............... G06N 10/20
2022/0180236 A1* 6/2022 Hann ................. G01R 31/3177

OTHER PUBLICATIONS

Touzard et al., Physical ReviewX 8, 021005 (2018) "Coherent Oscillations inside a Quantum Manifold Stabilized by Dissipation" (7 page).

Lescanne, "Exponential suppression of bit-flips in a qubit encoded in an oscillator", Nature Physics, vol. 16, No. 5, Jul. 26, 2019, XP055927392 and Supplemental Material 2020 (18 pages).

Berdou et. al., "One hundred second bit-flip time in a two-photon dissipative oscillator", arXiv:2204.09128, https://arxiv.org/pdf/2204.09128.pdf (20 pages).

Devoret et al. "Circuit-QED: How strong can the coupling between a Josephson junction atom and a transmission line resonator be?", Ann. Phys. 519, 767-779 (2007) (13 Pages).

Burgelman et.al. "Structurally stable subharmonic regime of a driven quantum Josephson circuit", https://arxiv.org/abs/220614631) (37 Pages).

Lescanne, "Engineering multi-photon dissipation in superconducting circuits for quantum error correction", Mar. 9, 2021, pp. 1-170, XP093042081, HAL open science, https://hal.science/tel-03164025 1-8 (170 pages).

International Search Report and Written Opinion for PCT Application No. PCT/EP2023/084628, dated Jan. 23, 202 (11 Pages).

\* cited by examiner

SUPERCONDUCTING QUANTUM CIRCUIT FOR BOSONIC CODES WITH GALVANIC COUPLING

CROSS-REFERENCE TO RELATED APPLICATIONS

This present application is a national stage application of International Patent Application No. PCT/EP2023/084628, filed Dec. 6, 2023, which claims priority to European Patent Application No. EP22306815.6, filed Dec. 7, 2022, the disclosures of which are hereby incorporated by reference in their entireties.

TECHNICAL FIELD

The present disclosure pertains to the field of superconducting quantum circuits, and more specifically, to superconducting quantum circuits including a cat qubit.

BACKGROUND

Cat qubits are a subset of bosonic codes, which form a family of error correction codes for quantum applications. Generally speaking, bosonic codes rely on storage of the qubits in bosonic modes. In the case of cat qubits, a 2-component cat code has been the most common design to date.

The dissipative stabilization of two coherent states utilizes an engineering of a non-linear conversion between two photons of a first mode that hosts the stabilized quantum manifold, wherein the first mode is also called a cat qubit mode, and one photon of a second mode, which is known as buffer mode, and conversely. Such a stabilization scheme allows for an exponential suppression of bit-flips with the number of photons in the two coherent states. However, this stabilization scheme is effective when the confinement rate of the two coherent states is larger than escape rates induced by external sources of noise. The confinement rate is directly related to the 2-to-1 photon conversion rate.

First implementations of this stabilization scheme (Leghtas et al., Science 347, 853 (2015) *"Confining the state of light to a quantum manifold by engineered two-photon loss"* and Touzard et al., Physical Review X 8, 021005 (2018) *"Coherent Oscillations inside a Quantum Manifold Stabilized by Dissipation"*) were unsuccessful in observing the exponential suppression of bit-flips because the superconducting circuit element used to engineer the 2-to-1 photon conversion, a so-called transmon, has spurious cross-Kerr terms which induce additional noise processes with escape rates given by the very large transmon-cat-qubit dispersive shift. The article *"Exponential suppression of bit-flips in a qubit encoded in an oscillator"*, Lescanne R. et. Al., Nature Physics, 2020 (hereinafter "Lescanne 2020") disclosed a much improved cat qubit by using an asymmetrical threaded superconducting quantum interference device (also referred to as "ATS") to engineer the 2-to-1 photon conversion. The ATS design has much lower cross-Kerr terms than the transmon, which allowed to observe the exponential suppression of bit-flips. However, a transmon was also used to measure the cat qubit state. Though less harmful to the cat qubit in this position, it still results in a saturation of the bit-flip time to a few milliseconds. A later work by Berdou et. al. in the article *"One hundred second bit-flip time in a two-photon dissipative oscillator"*. arXiv: 2204.09128, https://arxiv.org/pdf/2204.09128.pdf (hereinafter "Berdou 2022") succeeded at increasing the bit-flip saturation time by 5 order of magnitudes, up to 100 seconds, by removing the measuring transmon and operating the ATS in a regime where it is supposed to be dynamically stable. This tremendous increase in the bit-flip time was possible because the ATS alone adds spurious noise processes with very low escape rates. However, the confinement rate achieved in Berdou 2022 was very low.

The ratio of the confinement rate to the phase-flip rate of the cat qubit is the fundamental metric of quantum error correction with cat qubits. On the one hand, the confinement rate tells how strongly the cat qubit can be perturbed without experiencing a bit-flip, which is directly related to how fast a gate can be performed while preserving exponential suppression of bit-flips. On the other hand, the phase-flip rate tells in how much time one should perform the gates in order to allow for detection and correction of errors. Theoretical analysis suggest that this ratio should be larger than $10^4$. In Lescanne 2020 and Berdou 2022, this ratio is respectively 10 and 0.01.

At the time of writing, no other circuit is known which provides a well performing cat qubit. The average stability lifetime of the other known cat qubits are no better than a few milliseconds, which is insufficient for building quantum circuits which can be practically used. Since the confinement rate is directly related to the engineered 2-to-1 photon conversion rate, a massive increase of the later is required in ATS-based circuits.

SUMMARY

The present disclosure overcomes these challenges. To this end, a non-linear superconducting quantum circuit is described, which comprises at least one resonant portion and an asymmetrical threaded superconducting quantum interference device connected to said at least one resonant portion galvanically, said non-linear superconducting circuit having a first mode with a first resonant frequency and a second mode with a second resonant frequency, the ratio between said first resonant frequency and said second resonant frequency being different from ½. The at least one resonant portion is configured with inductance and capacitance values of its symbolic representation which induce with said asymmetrical threaded superconducting quantum interference device said first mode and said second mode such that said non-linear superconducting quantum circuit has zero-point fluctuations of the superconducting phase across the asymmetrical threaded superconducting quantum interference device for the first mode and the second mode which are superior or equal to 0.05 rad.

This superconducting quantum circuit is advantageous because it has no coupling element which would reduce the participation of the buffer and/or memory modes in the ATS. hence the 2-to-1 photon conversion rate. In theory, it could be possible to minimize the detrimental impact of the coupling capacitor in the circuit of Lescanne 2020, but large capacitors are known to be lossy in superconducting circuits, which would increase the phase-flip rate, and thus renders its application ineffectual in real-life implementation.

In various embodiments, the method may present one or more of the following features:

said at least one resonant portion has a symbolic representation in which the first mode is hosted in a first resonant portion comprising at least one inductance and at least one capacitor and the second mode is hosted in a second resonant portion comprising at least one inductance and at least one capacitor, said asymmetrical threaded superconducting quantum interference device being arranged between said first resonant portion and said second resonant portion and coupled thereto galvanically;

said at least one inductance and said at least one capacitor of said first resonant portion and said second resonant portion are in series or in parallel, respectively, and said asymmetrical threaded superconducting quantum interference device is in parallel or in series, respectively, with said first resonant portion and said second resonant portion;

said non-linear superconducting quantum circuit lies on a dielectric substrate and is delimited from a common ground plane by exposed portions of said dielectric substrate, and said first resonant portion and said second resonant portion are realized in physically distinct portions of said non-linear superconducting quantum circuit;

said non-linear superconducting quantum circuit is formed on a substantially planar substrate and has a width and a height which are shorter than the quarter wavelength corresponding respectively to said first resonant frequency and said second resonant frequency, said first resonant portion and said second resonant portion are galvanically isolated from said common ground plane;

said first resonant portion and said second resonant portion are galvanically connected to said common ground plane;

said non-linear superconducting quantum circuit lies on a dielectric substrate and is delimited from a common ground plane by exposed portions of said dielectric substrate, and said at least one resonant portion is realized into a transmission line;

the first mode and the second mode are respective fundamental or higher order harmonics of said non-linear superconducting circuit;

the first resonant frequency and the second resonant frequency are such that the difference between two times the first resonant frequency and the second resonant frequency is smaller than half the first resonant frequency and half the second resonant frequency; and one or more of said at least inductances and/or said transmission line is made by an array of Josephson junctions or a high kinetic inductance material.

The present disclosure also pertains to a quantum device comprising a non-linear superconducting quantum circuit according to embodiments herein, a first microwave source connected to said at least one resonant portion for providing a radiation having a frequency equal to said second resonant frequency, a second microwave source connected to said at least one resonant portion for providing a radiation having a frequency equal to the difference between two times the first resonant frequency and the second resonant frequency, and a load coupled to said at least one resonant portion such that specifically the second mode is coupled to said load, said first mode thereby hosting a cat qubit. The device may further comprise a microwave filter for coupling to said load, said microwave filter being arranged to let the second resonant frequency pass and to block the first resonant frequency.

The present disclosure also pertains to a quantum computing system comprising at least one device, according to the embodiments described herein.

BRIEF DESCRIPTION OF THE DRAWINGS

Other features and advantages of the present disclosure are readily available in the following description of the drawings, which show exemplary embodiments, and on which:

FIG. 10 represents a fourth embodiment of a galvanic cat circuit according to some embodiments;

DETAILED DESCRIPTION

Figure 1:
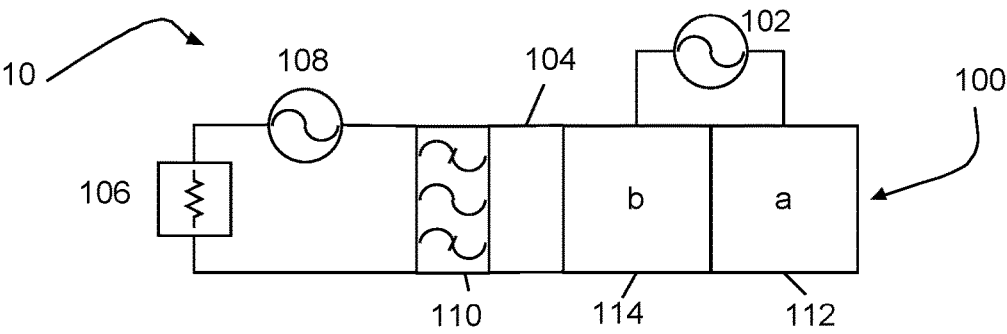
FIG. 1 illustrates how a galvanic cat qubit circuit is incorporated in a device to stabilize quantum information.

The drawings and the following description are comprised for the most part of positive and well-defined features. As a result, they are both useful in understanding the present disclosure, and can also be used to contribute to its definition, should the need arise.

For a cat qubit to encode useful data and be stabilized, a 2-to-1 photon conversion needs to occur between a first mode (the memory) and a second mode (the buffer). Most of the existing prior art belongs to a family of cat qubits stabilized by parametric pumping dissipation. Parametric pumping dissipation techniques are used to bridge the gap between the frequencies of the two modes and perform the resonant 2-to-1 photon conversion when the second mode does not have a resonant frequency which is a multiple of 2 of the resonant frequency of the first mode. In other words, the external time-varying excitation used in parametric pumping dissipation relaxes the constraint on the resonant frequencies.

The first mode and the second mode of the superconducting quantum circuit may each correspond to natural resonance frequencies of the circuit. For example, each of the first mode and the second mode are an electromagnetic mode. Each of the first mode and the second mode may have a respective resonant frequency, e.g., the first mode may have a resonant frequency of the type $$f_a = \frac{\omega_a}{2\pi}$$

and the second mode may have a resonant frequency of the type $$f_b = \frac{\omega_b}{2\pi},$$

where $\omega_a$ and $\omega_b$ may be the angular frequencies of each respective mode. By "having" a first mode and a second mode, it is meant that the superconducting quantum circuit may comprise components operating in a superconducting regime which host the modes independently of each other or concurrently. In other words, the first mode and the second mode may be hosted in different subsets of components of the superconducting circuit or on the same subset of components.

The superconducting quantum circuit may be operated at temperatures close to absolute zero (e.g., 100 mK or less, typically 10 mK), and isolated as much as possible from the environment to avoid energy loss and decoherence, except for some tailored couplings. For example, specifically the second mode may be coupled to a dissipative environment, while the first mode may remain isolated from the environment.

The superconducting quantum circuit may be manufactured as one or more patterned layers of superconducting material (e.g., aluminum, tantalum, niobium among others, as known in the art) deposited on a dielectric substrate (e.g., silicon, sapphire among others). Each of the one or more patterned layers may define lumped element resonators. A capacitive element may be formed (on a respective layer of the one or more patterned layers) with two neighboring plates of superconducting material. An inductive element may be formed with a superconducting wire. Alternatively, at least one of the one or more patterned layers may define portions of transmission lines each resonating at a frequency which depends on their length. The transmission lines may be, for example, co-planar wave guides, slotlines or microstrip lines. Yet alternatively, the circuit may be embedded in a 3D architecture which comprises high quality 3D modes machined or micro-machined into bulk superconductor that can be used as any of the two modes.

The circuit may be integrated into a device which may comprise a load, a first microwave source, a second microwave source and a coupler. The coupler may be configured to connect the second mode of the superconducting quantum circuit to the load. The load is a dissipative element, e.g., an element with a given resistance—as opposed to a superconducting element—that is external to the superconducting circuit. The load dissipates pairs of photons converted from the first mode to the second mode through the 2-to-1 photon conversion. In other words, pairs of photons destroyed from the first mode are evacuated through the second mode via the load to the environment. The first microwave source may be configured to control the microwave radiation in amplitude and phase so as to apply a microwave radiation at a frequency substantially equal to the frequency of the second mode. The first microwave source thus drives photons in the form of the microwave radiation into the second mode which, in turn, drives pairs of photons in the first mode through the 2-to-1 photon conversion. This 2-to-1photon conversion is reciprocal: it can conversely be 2 photons of the first mode to I photon of the second mode or 1 photon of the second mode to 2 photons of the first mode. The coupler is an element which may be connected galvanically, capacitively, or inductively to elements of the circuit hosting the second mode and which mediates the interaction between the second mode, the load and the microwave source.

The load may be a resistor, a matched transmission line, or a matched waveguide. The expression "matched" should be interpreted as meaning that the transmission line or the waveguide are terminated by a resistance at an end different from the end connected to the elements hosting the second mode, the value of such resistance being chosen such that the power going towards the load is mostly absorbed. The load may be comprised within the first microwave source.

In various examples, the first microwave source may be placed at room temperature and connected to the circuit via coaxial cables. In various examples, attenuators may be placed between the microwave source and the circuit—that is, along the path of the microwave radiation applied by the microwave source—to thermalize the microwave radiation with the cryogenic environment. This allows for the application of the microwave radiation without added thermal noise.

The second microwave source is used to provide microwave radiation at a frequency substantially equal to two times the resonant frequency of the first mode minus the resonant frequency of the second mode, so as to obtain the 2-to-1 photon conversion. Since the ATS has two superconducting loops which must be flux-pumped with adequate relative amplitude and phase, the radiation emitted by the second microwave source may be split to feed two different transmission lines or waveguides connected in the end to the two superconducting loops. Alternatively, two different microwave sources emitting signal at the same frequency as the second microwave source may be used to feed directly the two transmission lines or waveguides with adequate relative amplitude and phase.

Optionally, the device may comprise a microwave filter connected to the first mode and the second mode of the circuit. The microwave filter may be configured to specifically allow the coupling of the second mode to the load. This microwave filter may be interleaved between the load and the coupler. From the point of view of the circuit, this filter aims at preventing the microwave photons in the first mode from escaping the circuit. This can either be done by realizing a band stop filter at the first resonant frequency, or by realizing a bandpass filter at the second resonant frequency, or by realizing a high-pass (respectively low-pass) filter with a cutoff frequency in between the first and second resonant frequencies if the second (respectively first) resonant frequency is larger than the first (respectively second) resonant frequency, as the photon of the second mode are the ones that are being configured to dissipate in the environment. For some circuits, for instance when the two modes have different symmetries, the filter may not be necessary, and the proper position of the coupler in the circuit may be sufficient to prevent the dissipation of the first mode.

Thus, the device enables the stabilization of two coherent states in the first mode, that is, a quantum manifold of coherent states. For example, the first microwave source applying the microwave radiation to the second mode through the microwave filter may be seen as a 2-photon drive of the first mode once converted by the 2-to-1 photon conversion, and the load that dissipates photons of the second mode may be seen as a 2-photon dissipation of the first mode once converted by the 2-to-1 photon conversion. The 2-photon drive and 2-photon dissipation enables the stabilization of two coherent states in the first mode.

The single photon drive on the second mode is formally described by the Hamiltonian $$H_b = \hbar \epsilon_b b^\dagger + \hbar \epsilon_b^* b$$

where $\epsilon_b$ is the single photon drive rate on the second mode due to the first microwave source. The single photon dissipation on the second mode is formally described by the Lindblad operator $L_b = \sqrt{\kappa_b} b$ where $\kappa_b$ is the single photon dissipation resulting from the coupling of the second mode to the load.

The 2-photon drive is formally described by the Hamiltonian $H_2 = \hbar \epsilon_2 \alpha^{\dagger 2} + \hbar \epsilon_2 \alpha^2$ where $\epsilon_2$ is the effective 2-photon drive rate. The 2-photon loss is formally described the Lindblad operator $L_2 = \sqrt{\kappa_2} \alpha^2$ where $\kappa_2$ is the 2-photon dissipation rate. The amplitude $\alpha$ of the stabilized coherent states is finally given by $$\alpha = \left( \frac{2\epsilon_2}{\kappa_2} \right)^{1/2}.$$

The confinement rate of the coherent states is $\kappa_{conf} = \kappa_2 \alpha^2$.

In the regime $\kappa_b \gg g_2 \alpha$ where $g_2$ is the 2-to-1 non-linear conversion rate between the first mode and the second mode, the buffer dynamics can be adiabatically eliminated, which yields $\epsilon_2 = 2\epsilon_b g_2 / \kappa_b$ and $$\kappa_2 = 4g_2^2 / \kappa_b.$$

In various examples, the superconducting circuit may have a symbolic representation, e.g., consisting of a set of interconnected dipoles. The expression "symbolic representation" should be interpreted as designating an arrangement of symbols and lines which specify a set of interconnected dipoles. The set of interconnected dipoles (also called components) forms a circuit structure (or topology) equivalent (in functioning) to the non-linear superconducting circuit.

In other words, and as is classical in the field of superconducting circuits, the non-linear superconducting circuit is configured to achieve the functioning defined by its symbolic representation, in other words the functioning of the theoretical set of interconnected dipoles shown by the symbolic representation. Yet again in other words, while the circuit may be constructed using a patterned layer of superconducting material, it is to be understood that the circuit admits a symbolic representation by dipoles, for example, capacitors, inductors, and/or Josephson junctions. While the example dipoles describe discrete elements, it should be understood that these elements correspond to the equivalent circuit of distributed elements in a specific frequency range, e.g., at low frequency.

Such distributed elements may also have higher frequency modes which are irrelevant for the dynamics described herein. Hence, these distributed elements may be represented with the symbolic representation for ease of discussion herein. This symbolic representation may be refined by adding elements such as series inductors with each wire connection or a parallel capacitor between any two nodes of the circuit or adding nodes and branches to take into account other modes of the distributed elements. Thus, the symbolic representation allows for a better description of the distributed elements without changing the working principle of the circuit. Hence, the physical circuit-that is the circuit which is actually manufactured-and its symbolic representation are considered equivalent. Indeed, the refining dipoles of the symbolic representation specifically adjust the resonance frequencies or the zero-point fluctuation of the phase compared to the basic model. When designing the circuit, the final geometry may be fully and accurately simulated with a finite element solver, which will readily give the frequencies of the modes, the dissipation originating from the loads, and the zero-point fluctuation of the phase across the Josephson junctions, which are the unknowns when computing the 2-to-1 photon conversion rate in any configuration.

The 2-to-1 photon interaction Hamiltonian is of the form $$\frac{H_2}{\hbar} = g_2(t) a^2 b^\dagger + h.c.$$

In these cases, the coupling term $g_2(t)$ is modulated via the parametric pump, where the pump injects an external time-varying parameter having a frequency $\omega_p = 2\omega_a - \omega_b$. The parametric pump is used in the prior art to render the non-linear interaction resonant.

The development of cat-qubit quantum circuit relies on superconducting circuits geometries, which are configured to allow for the suppression of the bit-flips of a cat qubit encoded in a high-Q superconducting resonator, called the memory. For this purpose, a two-photon dissipation of the memory is engineered by coupling it to a low-Q superconducting resonator, called the buffer, through a non-linear superconducting dipole.

In the article Lescanne 2020, the non-linear Hamiltonian $H_2$ is engineered with an ATS superconducting dipole. The ATS dipole has the following potential energy:

$$U(\varphi) = 0.5 * E_L * \varphi^2 - 2 * E_J \cos(\varphi_\sigma) * \cos(\varphi - \varphi_\delta),$$

where $E_L$ is the Josephson energy of the ATS shunt inductance, $E_J$ is the Josephson energy of the ATS SQUID junctions, $\varphi_\sigma$ (respectively $\varphi_\delta$) is the magnetic flux threading the common (respectively differential) loop modes of the ATS.

By choosing the following DC values of the magnetic fluxes, known as the saddle point: $|\varphi_{\sigma,DC}| = |\varphi_{\delta,DC}| = \pi/2$, and flux pumping specifically the sigma mode with an amplitude $\varphi_p$ and frequency $\omega_p$, the potential energy becomes:

$$U(\varphi) = 0.5 * E_L * \varphi^2 - 2 * E_J * \sin(\varphi_p \cos(\omega_p t)) * \sin(\varphi)$$

The phase $\varphi$ across the ATS is related to the modes a and b by:

$$\varphi = \varphi_a(a + a^\dagger) + \varphi_b(b + b^\dagger)$$

Where $\varphi_\alpha$ and $\varphi_b$ are the zero-point fluctuations of the phase across the ATS of the first and second resonant mode, respectively. Expanding $U(\varphi_\alpha(\alpha + \alpha^\dagger) + \varphi_b(b + b^\dagger))$ at third order in $\varphi_\alpha$ and $\varphi_b$, and eliminating fast rotating terms yields the 2-to-1 conversion Hamiltonian $H_2$ with the 2-to-1 photon conversion rate $$g_2 = 0.5 * E_j * \varphi_a^2 * \varphi_b * \varphi_p.$$

The article Lescanne 2020 demonstrated that bit-flips are exponentially suppressed with the number of photons $\alpha^2$ of a cat qubit encoded in a resonator. However, this architecture uses a transmon coupled to the cat qubit as a measurement apparatus, which results in a bit-flip time saturating to a few milliseconds. This is due to the confinement rate being too small to resist to dispersive frequency shifts induced by the thermal excitations of the measurement apparatus. Later work by the Applicant, disclosed in the article Berdou 2022, increased the bit-flip saturation time by 5 orders of magnitude by removing the transmon and operating the ATS in a regime where it is supposed to be dynamically stable, despite an even lower confinement rate.

More precisely, in the article Lescanne 2020, the ratio of the confinement rate to phase-flip rate is 10, whereas in Berdou 2022, this ratio is 0.01. As explained in the introductory part of the present application, such ratios are very far from the theoretically needed values.

The main problem with Lescanne 2020 and Berdou 2022 is that they offer no potential solution to significantly increase the two-photon dissipation rate. Indeed, the two-photon dissipation rate is related to the two-photon coupling rate $$g_2 = 0.5 * E_j * \varphi_a^2 * \varphi_b * \varphi_p.$$

In the articles Lescanne 2020 and Berdou 2022, the buffer mode is localized on the ATS and the memory mode is weakly coupled capacitively to the buffer mode, hence to the ATS. This design allows one to make large $\varphi_b$, but $\varphi_a$ is typically one to two orders of magnitude smaller. Since the formula of $g_2$ depends on the square of $\varphi_a$, this circuit geometry is very detrimental to the strength of the two-photon dissipation.

The primary way to circumvent this problem is to sufficiently increase the capacitance coupling the memory and buffer modes of the circuits of Lescanne 2020 and Berdou 2022 to have the ATS participate strongly in both the buffer and memory modes. However, large capacitors are known to be lossy in superconducting circuits.

These prior arts are thus dead ends: their specific geometry is crucial to achieving the bit-flip stabilization, but it cannot be tweaked to allow for a large enough two-photon dissipation rate.

Examples and illustrations of the circuit and device, according to the embodiments herein, are now discussed with reference to the figures. In the following, the expression "galvanic cat qubit circuit", "circuit", "superconducting quantum circuit" and "non-linear superconducting circuit" are interchangeable and designate the circuit performing the 2-to-1 photon conversion allowing to stabilize the cat qubit.

FIG. 1 shows an example of a quantum device 10 comprising a galvanic cat qubit circuit, according to some embodiments.

The device 10 comprises a non-linear superconducting circuit 100, a microwave source 102, a coupler 104, a load 106, another microwave source 108, and a microwave filter 110.

The non-linear superconducting circuit 100 performs the 2-to-1 photon conversion between a first mode $\alpha$ referenced 112 and a second mode b referenced 114. In the following, first mode $\alpha$ hosts a cat qubit, which is also known as the memory mode, whereas second mode b is used as a buffer in between the cat qubit and the environment.

Device 10 uses parametric pumping to stabilize the cat qubit, which means that the resonance frequencies of the first mode and the second mode are not of the type $2f_\alpha = f_b$. In order to ensure the 2-to-1 photon conversion, a parametric pump provides radiation at a frequency of $2f_\alpha - f_b$. This is performed by microwave source 102 which is connected to the non-linear superconducting circuit 100.

As additionally described below; the non-linear superconducting circuit 100 is very specific in that it comprises an ATS ("Asymmetrical threaded SQUID" or "Asymmetrical threaded Superconducting quantum interference device") which is galvanically coupled to the other elements of the non-linear superconducting circuit 100 hosting both modes a and b.

The components of the circuit hosting the second mode 114 are coupled via coupler 104 to the load 106. This coupling renders the second mode as dissipative. The microwave source 108 is connected to the non-linear superconducting circuit 100 and is used to drive the second mode at its resonance frequency by emitting a radiation at frequency $f_b$. The microwave filter 110 is herein configured as a bandpass filter with a frequency $f_b$. Alternatively, the filter 110 may be configured as a band stop filter at a frequency $f_\alpha$, and may be placed in between the environment and the two modes to isolate the first mode and thus prevent the first mode from suffering additional losses coming from unwanted coupling to the load 106. Alternatively, if may be configured as a low-pass (respectively high-pass) filter if $f_\alpha > f_b$ (resp $f_b > f_\alpha$). In other embodiments, the microwave filter 110 can be omitted when coupling between the load 106 and the second mode can be established.

Figure 2:
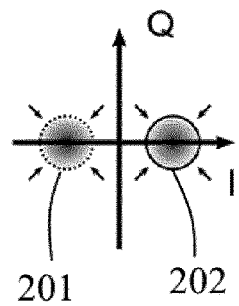
FIG. 2 illustrates how to use the galvanic cat qubit circuit incorporated in a device to stabilize quantum information.

FIG. 2 illustrates the stabilization a quantum manifold of coherent states of the first mode achieved by the 2-to-1 photon conversion performed by the circuit 100.

This figure illustrates the Wigner function of a first mode undergoing a two-photon drive with rate $\varepsilon_2$ and two-photon dissipation with rate $\kappa_2$ that has two stable steady states (201, 202) of amplitude $\alpha = \sqrt{2\varepsilon_2/\kappa_2}$ and with opposite phase. Since there are two possible states, one can encode information: the state $|0\rangle$ 202 is circled with a solid line and the state $|1\rangle$ 201 with a dotted line. This encoding is robust against bit-flip errors that flip the system between state $|0\rangle$ and state $|1\rangle$ due to the stable nature of the dynamics that converges to the two states. The encoding does not correct the other error channel, that is, phase-flip errors. However, an additional error correcting scheme may be added to treat this separately. This stabilization is made possible by coupling to an extra mode and by engineering a 2-to-1 photon conversion between the first mode and the second mode.

In the diagrams of FIGS. 3, 7, 9 and 10, specifically the circuit 100 will be described. The coupling to the load, the microwave source driving the buffer, and the microwave source driving the ATS for parametric pumping are voluntarily not shown for simplicity's sake.

Figure 3:
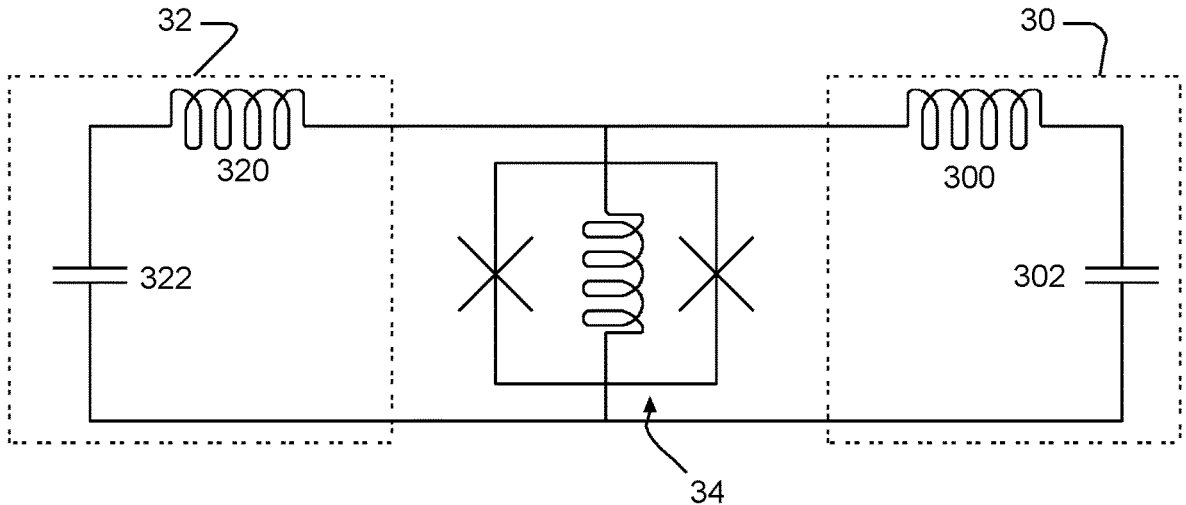
FIG. 3 represents an electrical equivalent diagram of a first embodiment of a galvanic cat circuit according to some embodiments.

FIG. 3 represents an electrical equivalent diagram of a first embodiment of the galvanic cat circuit 100 of FIG. 1.

Circuit 100 comprises a first resonant portion 30, a second resonant portion 32, and an ATS 34. Both the first resonant portion 30 and the second resonant portion 32 are galvanically connected to the ATS 34. In order to avoid any misunderstanding, the expression "galvanically coupled"

means that there are short electrically conducting portions which connect the first resonant portion 30 and the second resonant portion 32 to the ATS 34, i.e., a short electrically conducting track or any other mean ensuring a physically continuous conducting junction. The expression "short" means that the electrically conducting track has an impedance which is negligeable compared to the impedance of the ATS 34, the first resonant portion 30 and the second resonant portion 32 at the frequencies fa and fb. If this electrically conducting track has a non negligeable impedance, it will act as a voltage divider reducing the zero-point fluctuations $\varphi_a$ and $\varphi_b$ of the first and second resonant modes in the ATS, which is contrary to the aim of the description herein. In the example described here, the electrically conducting track is also arranged so that it does not shunt any of the first and second resonant portions.

This is opposed to a capacitive coupling or an inductive coupling in which the coupling is ensured by an electromagnetic field without physical contact between the two portions. In these cases, the impedance of the coupling capacitor or inductor due to the self-inductance of coupling mutual inductor is usually large and severely divides the zero-point fluctuations, hence the 2-to-1 photon conversion rate $g_2$.

In the embodiment described herein, the first resonant portion 30 comprises an inductive element 300 and a capacitive element 302, which are connected in series. Similarly, the second resonant portion 32 comprises an inductive element 320 and a capacitive element 322, which are connected in series. If the first resonant portion 30 (respectively second resonant portion 32) was isolated from the rest of the circuit 100, it would host a first bare mode (respectively second bare more).

As a result of the above circuit topology, the ATS 34 itself is the coupling element in between the first bare mode and the second bare mode. This topology naturally allows for resonant modes, which result from the interaction of the first bare mode, the second bare mode. and the ATS 34, to participate strongly in the ATS 34. By coupling the second mode to a cold bath (the load 106) in which photons are dissipated, the second mode is more lossy and constitutes the buffer mode, while the first mode is less lossy and constitutes the memory mode.

Using $L_a$ as the value of inductive element 300 (respectively $L_b$ with inductive element 320) and $C_a$ as the value of capacitive element 302 (respectively $C_b$ with capacitive element 322), this first bare mode (respectively second bare mode) can be described:

by its angular frequency $w_{a0}=1/\sqrt{L_{a,eff}*C_\alpha}$ (respectively $w_{b0}=1/\sqrt{L_{b,eff}*C_b}$), where $$L_{a,eff} = L_a + \frac{L_{ats}L_b}{L_{ats} + L_b} \left(\text{respectively } L_{b,eff} = L_b + \frac{L_{ats}L_a}{L_{ats} + L_a}\right)$$

by its impedance $Z_{a0}=\sqrt{L_{\alpha,eff}/C_\alpha}$ (respectively $Z_{b0}=\sqrt{L_{b,eff}/C_b}$), or equivalently
by its bare zero-point fluctuations $\varphi_{a0}=\sqrt{\pi*Z_{a0}/R_q}$ (respectively $\varphi_{b0}=\sqrt{\pi*Z_{b0}/R_q}$), where $R_q=h/4e^2$ is the superconducting resistance quantum.

The inductance $L_{ats}$ is the effective inductance value of the ATS 34 in the vicinity of the global minimum of its potential energy. At the saddle point, the effective inductance $L_{ats}$ is equal to the shunt inductance of the ATS 34.

When the first resonant portion 30 and second resonant portion 32 are galvanically connected to the ATS, the linear part of the Hamiltonian of the circuit reads:

$$H_{lin} = w_{a0}a_0^\dagger a_0 + w_{b0}b_0^\dagger b_0 + g(a_0 + a_0^\dagger)(b_0 + b_0^\dagger)$$

Where the coupling rate $g=\sqrt{w_{a0}*w_{b0}} * k$, with the dimensionless coupling constant $k=L_{ats}/\sqrt{(L_\alpha+L_{ats})*(L_b+L_{ats})}$.

The aforementioned modes a and b are the modes diagonalizing the Hamiltonian Hlin. The dimensionless coupling constant k can take any value in between 0 and 1. A value close to 0 means weakly coupled modes while a value of 1 means maximally coupled modes. A value close to 0 is obtained when $L_{ats}<<L_a$, $L_b$. A value of the order of ½ is obtained when $L_{ats}\sim L_a$, $L_b$. A value close to 1 is obtained when $L_{ats}>>L_a$, $L_b$. The galvanic design is configured to easily reach values of k of order ½ and 1, since the ATS has a kinetic superconducting inductance. This will further increase the zero-point fluctuations. The possibility to reach such large coupling constants is specific to the field of superconducting circuits as was first shown in Devoret et al. "*Circuit-QED: How strong can the coupling between a Josephson junction atom and a transmission line resonator be?*", Ann. Phys. 519, 767-779 (2007).

As will be shown in additional detail with FIGS. 5, 6, 9 and 10, the inductive element and capacitive element form an LC resonator which may be implemented by distributed elements in the patterned layer of the superconducting material, such as:

two neighboring plates forming a capacitor in parallel with a superconducting wire, a single Josephson junction or an array of Josephson junctions forming an inductor;

a portion of superconducting transmission line which ends with two different boundary conditions (shorted to ground at one end and open at the other) forming a so-called λ/4 resonator. The transmission line being for example of the coplanar waveguide type or the microstrip type; or a portion of superconducting transmission line which ends with two identical boundary conditions (open-open or short-short) forming a so-called λ/2 resonator, the transmission line being for example of the coplanar waveguide type or the microstrip type.

The ATS 34 is realized as known in the art, for example in the article Lescanne 2020. It is a structure with two Josephson junctions in parallel, with an inductive element in parallel between them. As a result, the ATS 34 comprises two connected loops, each loop comprising a Josephson junction in parallel with the shunt inductive element. The ATS 34 has both of its loops flux biased in DC and AC. The DC bias sets the working point of the ATS. It may be operated near the so-called saddle point, which is a sweet spot in frequency and has small cross-Kerr terms. The AC flux bias corresponds to the parametric pump at $2f_a$-$f_b$. This AC flux bias is usually chosen to drive the common mode of the two loops.

Figure 4:
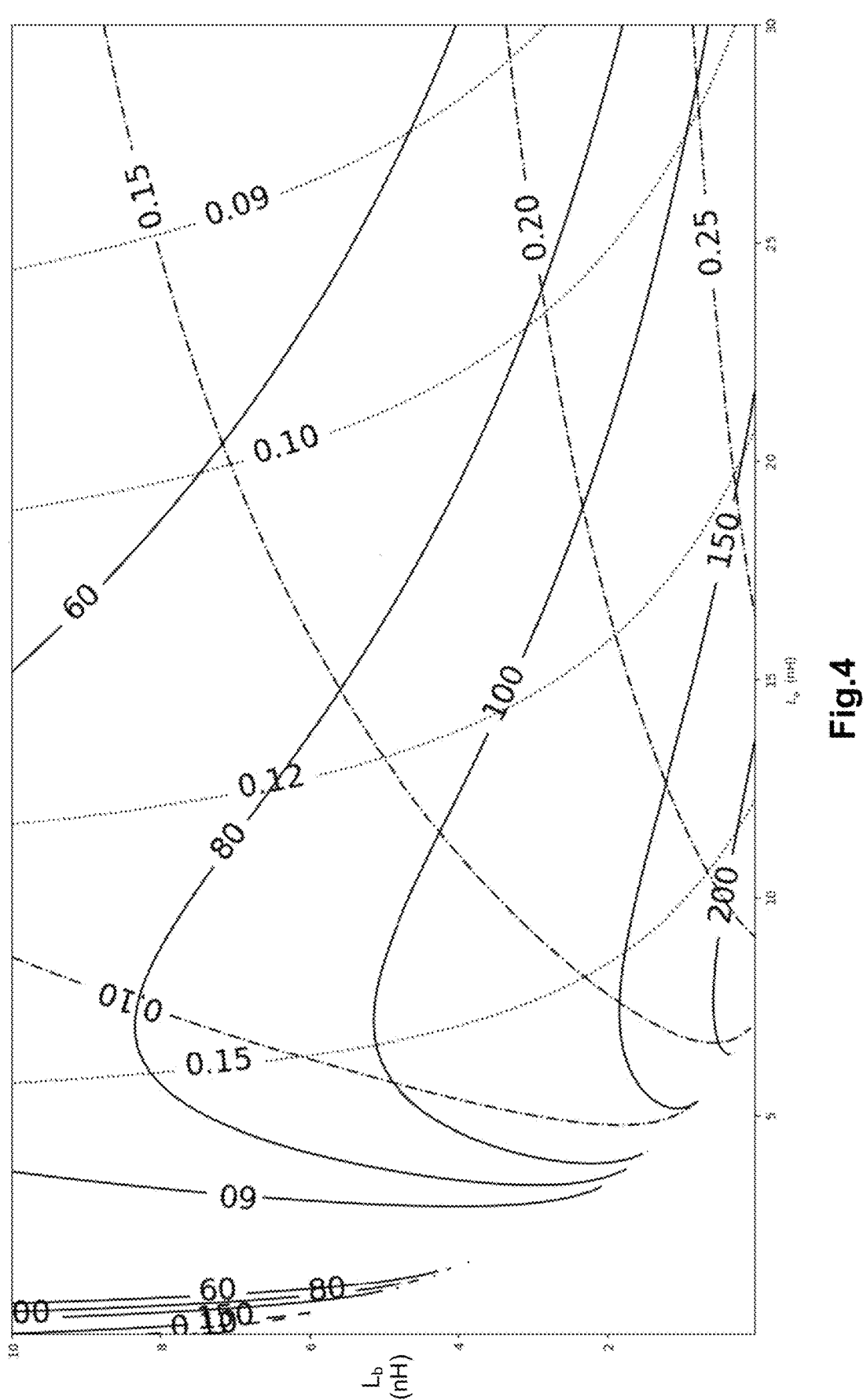
FIG. 4 shows a diagram illustrating values of o for respectively the first mode and the second mode of the superconducting quantum circuit of FIG. 3, along with corresponding $g_2/\varphi_p$ values.

FIG. 4 shows the results of $g_2/\varphi_p$ value curves which can be obtained for various values of the inductive elements 300 and 320, a typical value of 4 nH for the ATS inductance and fixed frequencies $f_a$=4.5 GHz and $f_b$=8.0 GHz. On this figure, the value da for the first mode is shown in radian as a dotted line, the value of $\varphi_b$ for the second mode is shown in radian as a dashed-dotted line, and corresponding $g_2/\varphi_p$ level lines are shown in MHz in full. These curves are established by varying the value of inductive element 300 as easting, and the value of inductive element 320 as northing, while choosing the values of the capacitive elements 302 and 322 to obtain the above frequencies.

The reason for plotting the ratio $g_2/\varphi_p$ is that $\varphi_p$ is proportional to the amplitude of the parametric flux pump which is set by the amplitude of the microwave source 102, which is somehow arbitrary. On the contrary, the ratio $$\frac{g_2}{\varphi_p} = 0.5 * E_j * \varphi_a^2 * \varphi_b$$

depends specifically on intrinsic parameters of the circuit 100. FIG. 4 is calculated by assuming the ATS 34 is operated at its saddle point. In this case, the values of $\varphi_a$, $\varphi_b$, $w_a$ and $w_b$ depend specifically on the inductance $L_{ats}$ of the ATS and are independent of $L_j$. Since the Josephson energy $E_j$ reads $$E_j = \frac{\varphi_0^2}{L_j},$$

it sounds like one can make $g_2/\varphi_p$ arbitrarily large by ever decreasing $L_j$. However, the ATS dynamics becomes more instable as the ratio $L_{ats}/L_j$ is increased (as evidenced in the article by Burgelman et.al. "*Structurally stable subharmonic regime of a driven quantum Josephson circuit*", https://arxiv.org/abs/2206.14631). In FIG. 4, this ratio is set to $L_{ats}/L_j$=2, which corresponds to the value in Lescanne 2020.

This figure shows that, for conventional values of inductive elements 300 and 320, values of $g_2/\varphi_p$ of over 100 MHz can easily be attained. In effect, the works by the Applicant have shown that values over 50 MHz are guaranteed, which is close to an order of magnitude over the known prior art, and that values of several hundreds MHz can be achieved. In comparison, the value of $g_2/\varphi_p$ achieved in Lescanne 2020 was 9.6 MHZ. In Berdou 2022, it was at least 1 order of magnitude smaller than that.

FIG. 4 also shows the zero-point fluctuations $\varphi_a$ and $\varphi_b$. Even though specifically the product $$\varphi_a^2 * \varphi_b$$

matters for $g_2$, the actual values of $\varphi_a$ and $\varphi_b$ have a direct impact on the spurious terms generated by the ATS, which may in turn induce noise processes escaping the confinement of the stabilized coherent states.

Since the 2-to-1 photon conversion Hamiltonian relies on a third order expansion of the ATS potential energy in $\varphi_\alpha *$ $(\alpha+\alpha^\dagger)$ and $\varphi_b * (b+b^\dagger)$, a rule of thumb known from the man skilled in the art is to keep $\varphi_\alpha * \max(\alpha, \frac{1}{2})$ and $\varphi_b * \max(\beta, \frac{1}{2})$ small compared to $\pi$. Here, $\alpha$ is the amplitude of the coherent state stabilized in the cat qubit and $\beta$ is the amplitude of the residual electromagnetic field in the buffer.

The term $\frac{1}{2}$ in $\max(\alpha$ or $\beta, \frac{1}{2})$ is used to account for the minimal zero-point fluctuations. With a typical value of $\alpha=2$, it is considered safe to keep $\varphi_a$<0.1. On the other hand, $\beta$ tends to be very close to zero, so $\max(\beta, \frac{1}{2})=\frac{1}{2}$. It means larger values of $\varphi_b$ can be tolerated, typically $\varphi_b$<0.3. FIG. 4 shows that $g_2$ can be increased to more than one order of magnitude compared to the state-of-the-art while keeping safe values of the parameters.

FIG. 4 also shows that more aggressive values of $\varphi_a$ and $\varphi_b$ could be easily reached, resulting in a further increase of $g_2$. It should be noted that it is not known yet by how much $\varphi_a$ and $\varphi_b$ can be pushed, since the cat qubit domain is quite recent and lacks such studies. The galvanic cat design, with its obvious potential to realize large $\varphi_a$ and $\varphi_b$, will therefore allow to perform such studies.

Figure 11:
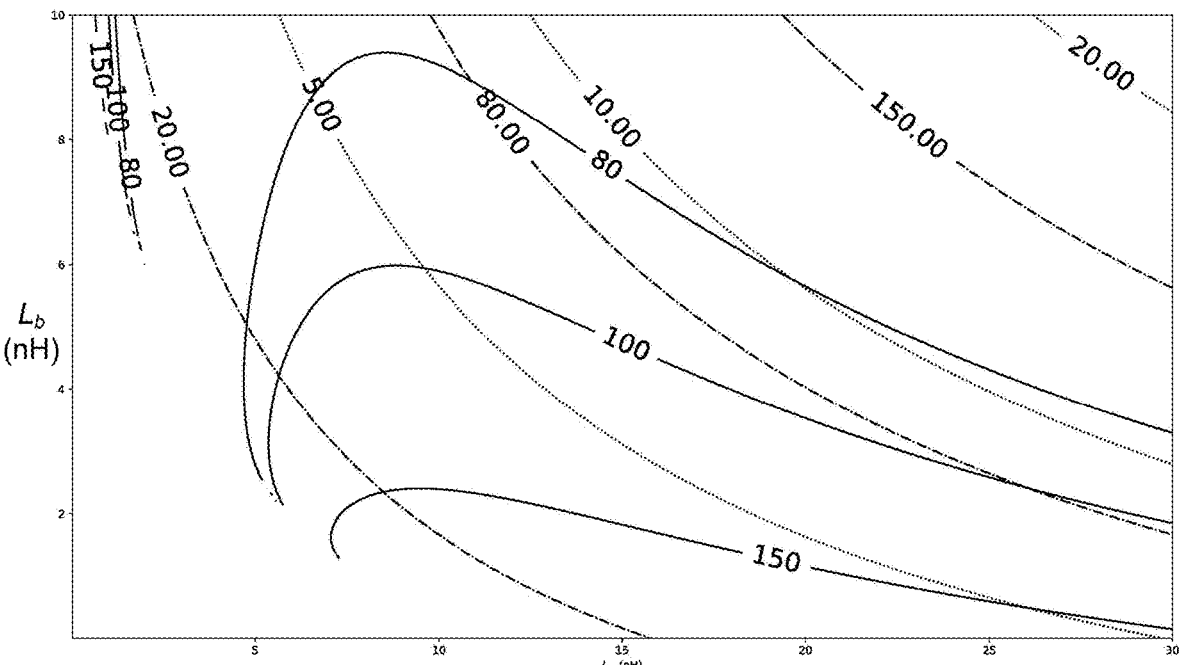
FIG. 11 shows the ratio of the square of the zero-point fluctuations of the phase of modes b and a in the capacitor and inductor of the second resonant portion for the first embodiment, along with corresponding $g_2/\varphi_p$ values, in complement to FIG. 4.

FIG. 11 shows the ratio $$\left(\frac{\varphi_{b,C_b}}{\varphi_{a,C_b}}\right)^2$$

as dotted lines and the ratio $$\left(\frac{\varphi_{b,L_b}}{\varphi_{a,L_b}}\right)^2$$

as dash-dotted lines of the square of the zero-point fluctuations of modes b and a across the capacitor 322 and inductor 320, respectively, of the second resonant portion 32. The decay rates of modes a and b in the load are proportional to the square of, respectively, $\varphi_{a,c_b}$ and $\varphi_{b,c_b}$ if the load is coupled with the coupler 104 to the capacitor 322 of the circuit 100, and to the square of, respectively, $\varphi_{a,L_b}$ and $\varphi_{b,L_b}$ if the load is coupled to the inductor 320. Thus, these ratios tell by how much mode a is protected from a decay in the load depending on how the load is coupled to the circuit. When the load is coupled to the capacitor 322, as is usually done in the field of superconducting circuits, the ratio takes values of order 10 in the region of safe parameters. This level of protection is not very large, but the wide spacing in frequency in between $f_a$ and $f_b$ allowed by the large k of the galvanic design gives room to implement strong and efficient filtering. Remarkably, when the load is connected to the inductor 320 of the second resonant portion 32, which can be done using an inductive coupler for instance, the ratio $$\left(\frac{\varphi_{b,L_b}}{\varphi_{a,L_b}}\right)^2$$

takes values 10 times larger, which is already quite good and can easily be improved to necessary level with basic realizations of the filter 110.

This is all the more surprising as the idea of galvanically coupling the ATS to both modes results in strongly hybridized modes owing to the large value of k. Having a low loss memory mode and strong hybridization is highly counterintuitive. The rationale is that the field of quantum computing is quite young, especially in the cat qubit domain, and it is generally preferred to make very incremental changes. One of the reasons to have an ATS localized on the second mode and have the first mode weakly coupled capacitively to the second mode in Lescanne 2020 and Berdou 2022 is to minimize the decay of the first mode due to the decay of the second mode in the load. Indeed, conventionally, it is considered much preferable to couple the non-linear elements of the quantum circuit to a single mode and weakly couple other modes to it.

Galvanically coupling the non-linear element is manifestly not an incremental change and goes against all prejudices. Furthermore, the methods and systems described herein are able to achieve coupling of substantially simply the buffer mode to the environment despite the strong hybridization of the first mode and the second mode induced by the galvanic coupling through the ATS.

Another advantage of the galvanic coupling and large values of k is that the first resonant frequency and the second resonant frequency can be chosen so that the value $2f_\alpha - f_b$ is somewhat far from both fa and fb. For example, $2f_\alpha - f_b$ is made smaller than $f_\alpha/2$ and $f_b/2$. This can be obtained by choosing a buffer frequency fb not too far from twice the memory frequency $f_\alpha$ which results in a small pump frequency $f_p = 2f_\alpha - f_b$. For instance, the value of $f_p$ is 1 GHz in FIG. 4, which is more than four times smaller than $f_\alpha$ and eight times smaller than $f_b$.

It is advantageous because the first order term of the expansion of the ATS potential energy shows that the parametric pump can directly drive the circuit. As shown in the Supplementary Material of Lescanne 2020, this driving results in spurious dynamical AC Stark shift and dynamical cross-Kerr terms, which are detrimental to the cat qubit operations. With a low pump frequency, the direct driving of the circuit is much less efficient, which results in much smaller dynamical AC Stark shift and dynamical cross-Kerr.

Another advantage is that the value $2f_\alpha - f_b$ can be made distant from both $f_a$ and $f_b$, such that a second microwave filter could be introduced into the parametric pump line to prevent the first mode from leaking into the parametric pump line.

Finally, a large spacing in frequency in between fa and fb makes the design more robust to nanofabrication uncertainties, such as the well-known problem of the variability of the inductances of the various Josephson junctions in the circuit, which primarily affects the accuracy of the prediction of $f_a$ and $f_b$.

Figure 5:
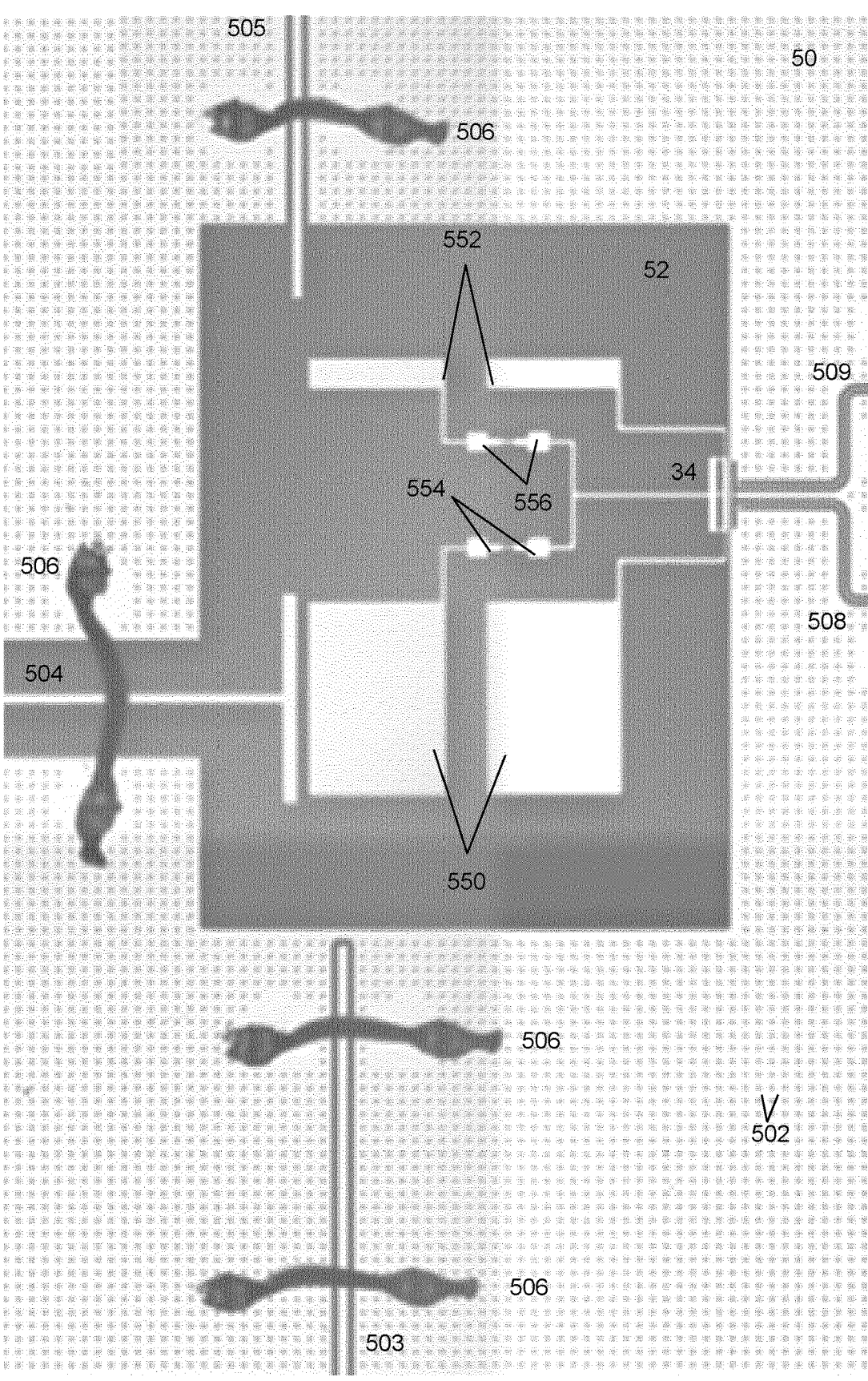
FIG. 5 represents a first realization of the circuit of FIG. 3.

FIG. 5 shows a first realization of the circuit of FIG. 3.

The figure is an optical microscope image of the surface of a superconducting chip, manufactured by the Applicant to correspond to the circuit of FIG. 3. White parts correspond to metallized surface with tantalum or aluminum. Grey parts correspond to the substrate made in sapphire on which the circuit lies. Other materials can be used to realize the superconducting circuit, for instance niobium, NbTi or TiN for the metallization and silicon or quartz for the chip.

The circuit comprises a ground plane 50, on which the circuit 52 is formed. The ground plane 50 is regularly punctured to reveal the substrate (grey dots referenced 502). These punctures are realized in order to reduce the magnetic noise by trapping superconducting vortices, but they are optional and could be omitted. Five transmission lines referenced 503, 504, 505, 508 and 509 are used to bring the radiations to and from the circuit. Those transmission lines are implemented with CPW (coplanar waveguide). Line 503 allows to excite the cat qubit. Line 504 is a bus connected at its other end to a readout transmon used to measure the cat qubit. Line 505 is the beginning of the filter 110 connected to the load 106 and the microwave source 108. Four wire bonds 506 are also provided to ensure equipotentiality over the ground plane 50. Finally, two flux lines 508 and 509 are used to pump the flux $\varphi_o$ of the ATS 34 with the microwave source 102 and to set the DC working point of the ATS 34 by applying a DC current.

The circuit of FIG. 5 shows a lumped and differential realization of the resonant modes of the circuit of FIG. 1. This design is said to be lumped because the total size of the circuit 100 is shorter than the quarter-wavelength of the first mode and of the second mode. This design is said to be differential because the first mode and the second mode correspond to oscillations of charge and current in between pairs of electrodes, which are galvanically isolated from the ground plane 50.

The pair of big rectangular electrodes referenced 550 and 552 respectively realize the capacitors 302 of the first mode (the memory mode) and 322 of the second mode (the buffer mode). Tiny lines in between two pairs of small metallic pads referenced 554 and 556 are chains of Josephson junctions and respectively realize the inductors 300 of the first mode and 320 of the second mode. Other realization of the inductors could be possible, for instance geometric inductors made of meandered or spiraled lines. The ATS 34 is located near the flux lines 508 and 509, which drive it.

This design occupies more space than other designs, but it has the advantage of offering a better isolation to the lossy components of the ground place, such as the wire bonds 506, or other components that may be patterned on the chip, such as other cat qubits, and thus reduce crosstalk.

Figure 6:
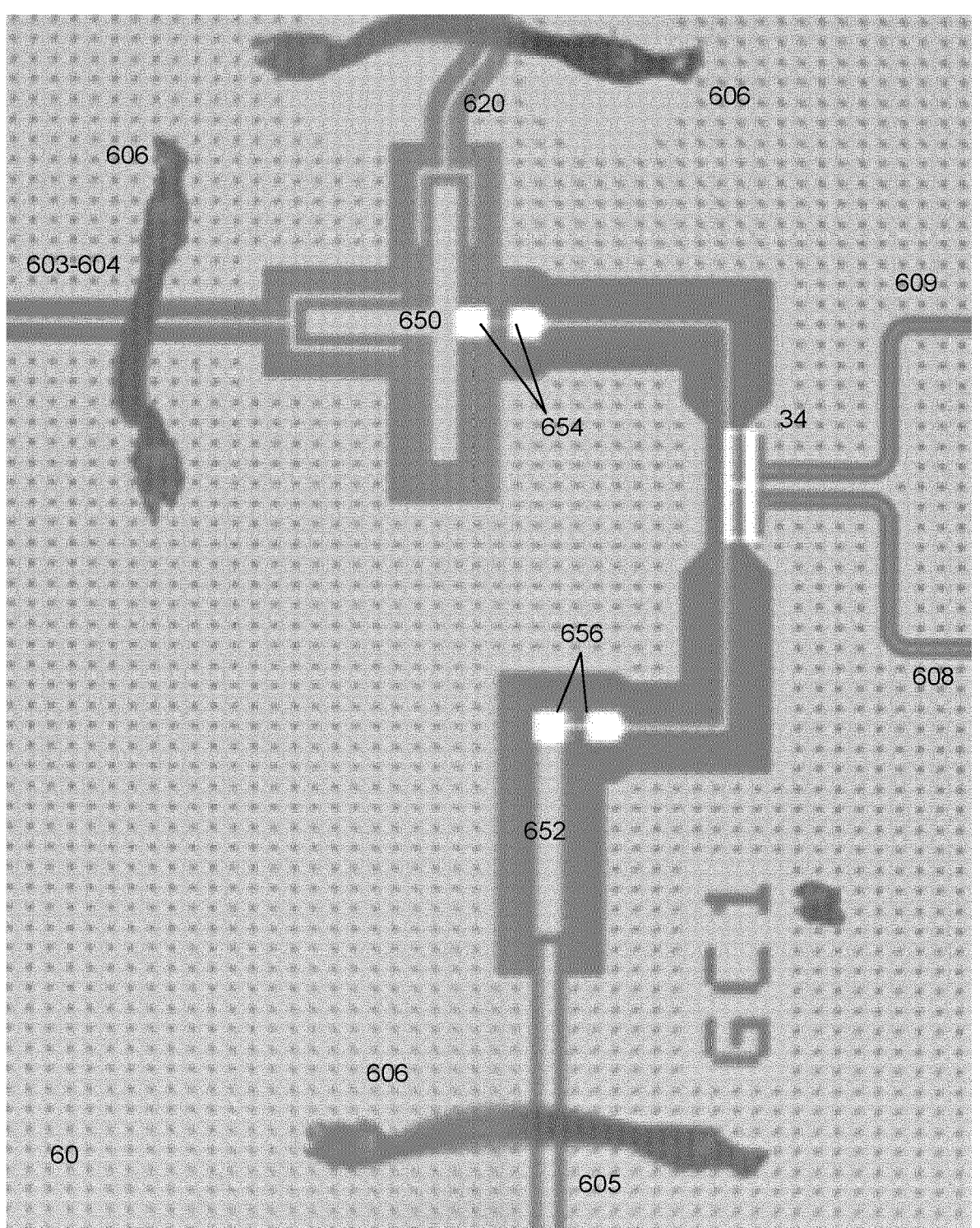
FIG. 6 represents a second realization of the circuit of FIG. 3.

FIG. 6 shows a second realization of the circuit of FIG. 3.

Like FIG. 5, this figure is an optical microscope image of the surface of a superconducting chip, manufactured by the Applicant to correspond to the circuit of FIG. 3. White parts correspond to metallized surface with tantalum or aluminum. Grey parts correspond to the substrate made in sapphire on which the circuit lies. Other materials can be used to realize the superconducting circuit, for instance niobium, NbTi or TiN for the metallization and silicon or quartz for the chip.

Similar elements have been given like reference numerals. Only the first number of the reference numeral will change from "5" to "6", i.e., ground plane 50 of FIG. 5 is referenced 60 on FIG. 6.

This realization is different from that of FIG. 5 in that it shows a lumped and grounded realization of the resonant modes of the circuit of FIG. 3. This realization is said to be grounded because the first mode and the second mode correspond to oscillations of charge and current in between electrodes and the ground plane 60 to which they are galvanically coupled through the ATS 34. The bottom electrode of the ATS is indeed imprinted directly on the ground plane 60.

The memory mode capacitor 302 is made of a single electrode, which is T-shaped formed and referenced 650. The buffer mode capacitor 322 is made of a single electrode, which is a horizontal bar 652.

A significant difference with the circuit of FIG. 5 is that, in this realization, the memory mode is connected to another galvanic cat circuit not shown by means of a transmission line 620. Furthermore, the drive line 503 of the memory mode and the bus line 504 to couple the memory mode to a readout transmon are merged in a single line referenced 603-604.

This grounded design is more sensitive to the imperfections of the ground plane and may experience more crosstalk than the differential design, but it is much more compact. Furthermore, coupling the ATS to the flux lines is stronger.

Figures 7, 8:
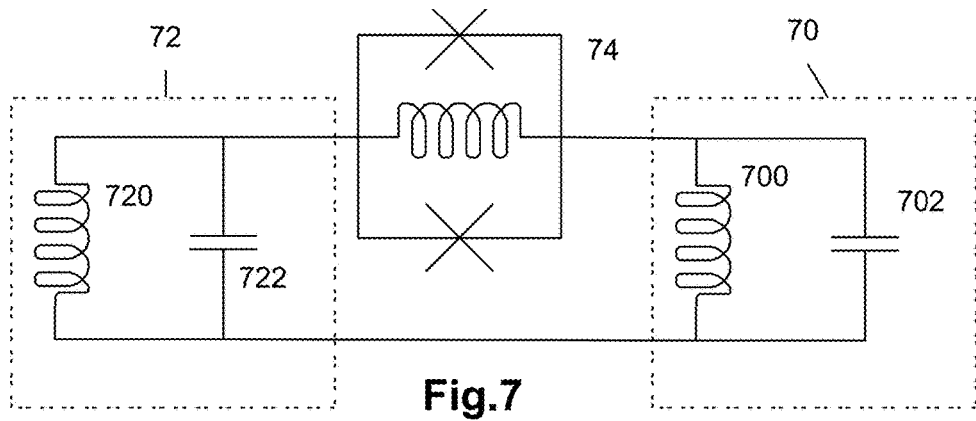
FIG. 7 represents an electrical equivalent diagram of a second embodiment of a galvanic cat circuit according to some embodiments.
FIG. 8 shows a diagram illustrating values of o for respectively the first mode and the second mode of the superconducting quantum circuit of FIG. 7, along with corresponding $g_2/\varphi_p$ values.

FIG. 7 represents a second embodiment which is similar to FIG. 3. The difference here is that the inductances and capacitors in the first resonant portion and the second resonant portion are in parallel instead of being in series. As a result, the ATS is connected to the first and second resonant portions in series instead of being in shunt. The circuit of FIG. 7 is the electronic dual of the circuit of FIG. 3. All the equations of the circuit of FIG. 3 remain valid, except that:

$$L_{a,eff} = \frac{L_{ats}L_a}{L_{ats} + L_a}, \; L_{b,eff} = \frac{L_{ats}L_b}{L_{ats} + L_b}, \; k = \sqrt{\frac{L_a L_b}{(L_{ats} + L_a)(L_{ats} + L_b)}}$$

Similar elements have been given like reference numerals. Only the first number of the reference numeral will change from "3" to "7", i.e., first resonant mode 30 of FIG. 3 is referenced 70 on FIG. 7.

FIG. 8 is a figure similar to FIG. 4, but based on the circuit of FIG. 7. For simplicity's sake, it will not be described further.

It will clearly appear to the man skilled in the art that the realizations of FIG. 5 and FIG. 6 can be adapted to put in practice the design of FIG. 7.

Figure 9:
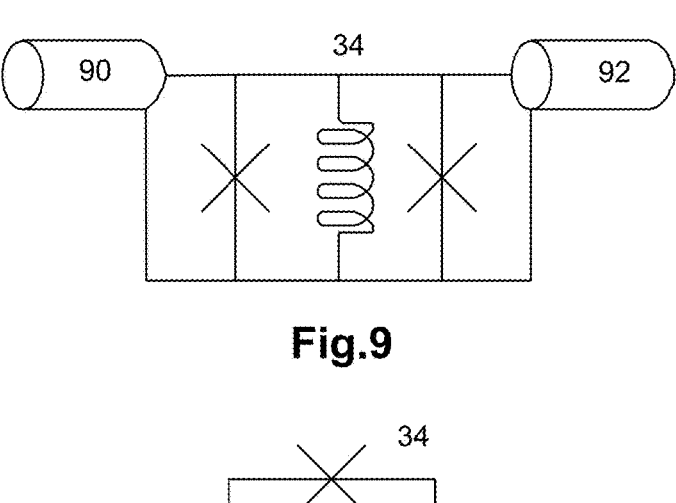
FIG. 9 represents a third embodiment of a galvanic cat circuit according to some embodiments.

FIG. 9 represents a third embodiment of the galvanic cat circuit. This embodiment is different from the embodiments of FIG. 3 and FIG. 7 in that the properties of the first resonant mode and of the second resonant mode are usually not accurately described with a simplified symbolic representation involving specifically two LC resonators. This exemplifies the reason why the methods and systems described herein go against the existing prejudices: while a low coupling constant k would allow for a good understanding of the first mode and the second mode from a simple perturbative analysis including specifically two bare modes of the resonant portion and the ATS, it cannot be so here, and more bare modes of the resonant portion have to be taken into account.

In the embodiment of FIG. 9, there is specifically one resonant portion which produces both the first mode and the second mode together with the ATS 34. As shown on this figure, the ATS 34 is shunting an open-ended transmission line into two portions 90 and 92. This circuit is galvanic since the ATS is symbolically embedded in the transmission line hosting the resonant modes. If the dimensionless coupling constant k was small, the first mode of the quantum circuit would simply correspond to an LC circuit formed with the ATS and the static capacitance of the transmission line; the second mode would correspond to the bare $\lambda/2$ harmonics of the transmission line coupling to the ATS: the third mode would correspond to the bare $\lambda$ harmonics of the transmission line coupling to the ATS; etc. With larger k, however, the symbolic inductance and capacitance values associated with the different bare harmonics of the transmission line are dimensioned altogether to produce the first mode and the second mode when associated with the ATS 34.

The transmission line can be realized in the same materials as the elements of FIG. 5 and FIG. 6. If the characteristic impedance required to reach a given $\varphi_b$ or $\varphi_a$ is too large to be made geometrically, the center conductor of the transmission line could be replaced by a high kinetic inductance material or a chain of wide Josephson junctions. Finally, the transmission line could be realized with various geometries, for instance coplanar waveguide (CPW), microstrip or slotline. In the example of FIG. 9, CPW portion 90 could be capacitively or inductively connected to the microwave filter 110 and the load 106 for coupling to the environment.

Figures 12A, 12B:
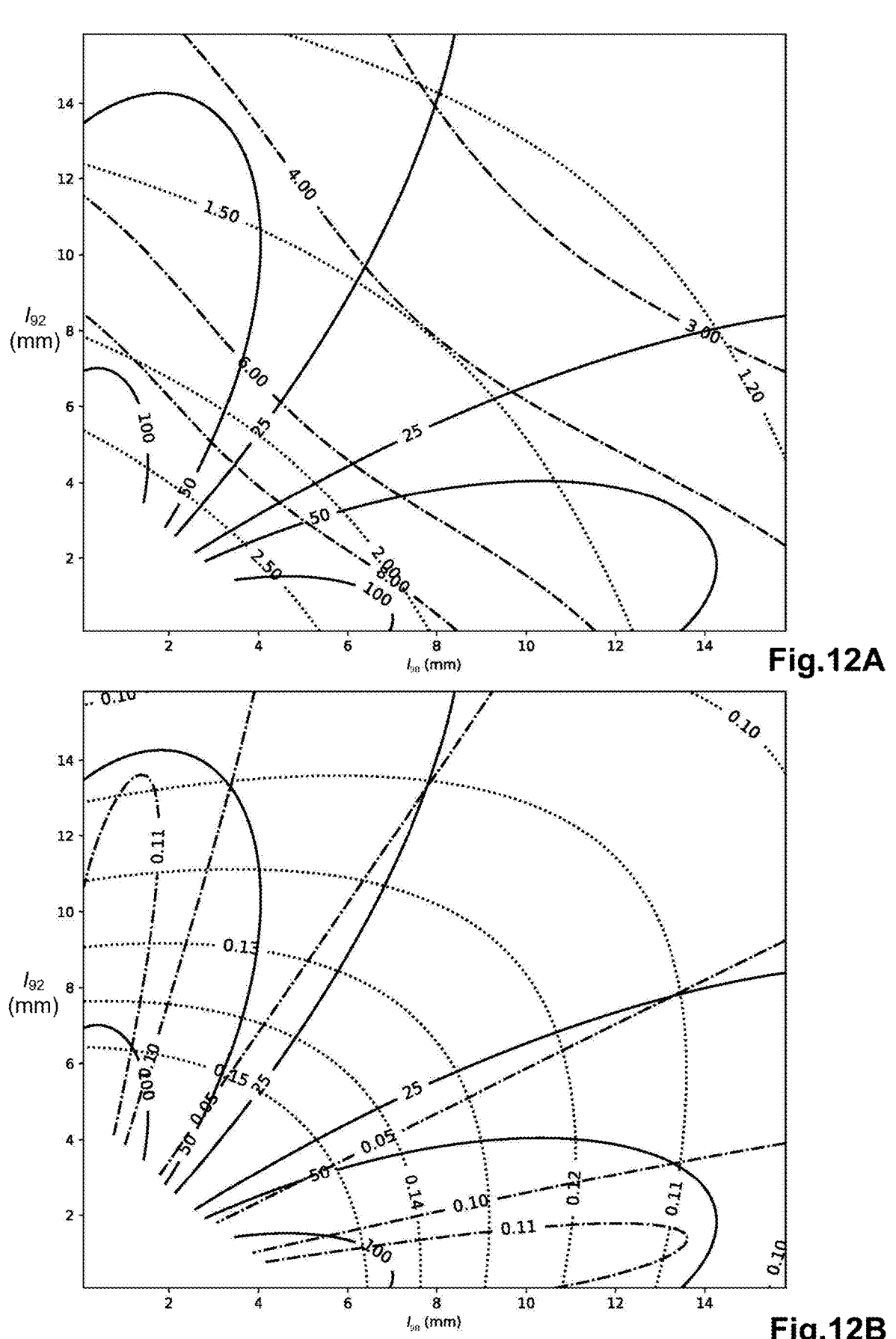
FIGS. 12A and 12B show diagrams illustrating values of o and f for respectively the first mode and the second mode of the superconducting quantum circuit of FIG. 9, along with corresponding $g_2/\varphi_p$ values.

FIGS. 12A and 12B represent the results of $g_2/\varphi_p$ value curves which can be obtained for various lengths of the CPW portions 90 and 92. In this figure, the ATS parameters are the same as in FIG. 4. The CPW is assumed to have a characteristic impedance of 50 $\Omega$ and, without loss of generality. an effective relative permittivity $\epsilon_r$=5.6, typical for CPW on sapphire, is taken. Furthermore, the first resonant mode (respectively second resonant mode) is taken as the first (or fundamental) harmonics (respectively second harmonics) of the quantum circuit 100. On FIG. 12A, the value $f_a$ for the first resonant frequency of the circuit is shown in GHz as a dotted line, the value $f_b$ for the second resonant frequency of the circuit is shown in GHz as a dashed-dotted line, and corresponding $g_2/\varphi_p$ level lines are shown in MHz in full. FIG. 12B, the value $\varphi_a$ for the first mode is shown in radian as a dotted line, the value of $\varphi_b$ for the second mode is shown in radian as a dashed-dotted line, and corresponding $g_2/\varphi_p$ level lines are shown in MHz in full.

Contrary to FIG. 4 and FIG. 8, it is necessary to show the first resonant frequency and the second resonant frequency variation as they are not fixed. It appears that large detunings $f_b$–$f_a$ of several GHz can be reached, as well as values of $g_2/\varphi_p$ well beyond the state-of-the-art for safe values of $\varphi_a$ and $\varphi_b$.

It is obvious to the man skilled in the art that it is possible to adjust the values of $f_a$, $f_b$, $\varphi_a$, $\varphi_b$ and $g_2/\varphi_p$ in order to fit a given application by tweaking, for instance, the characteristic impedance of the transmission line, or using other harmonics. It is also possible to change the terminations of the transmission lines, though some terminations, for instance an inductive short, have to be included in the potential energy of the ATS and, as a consequence, would modify its working point and dynamics.

Figures 13A, 13B:
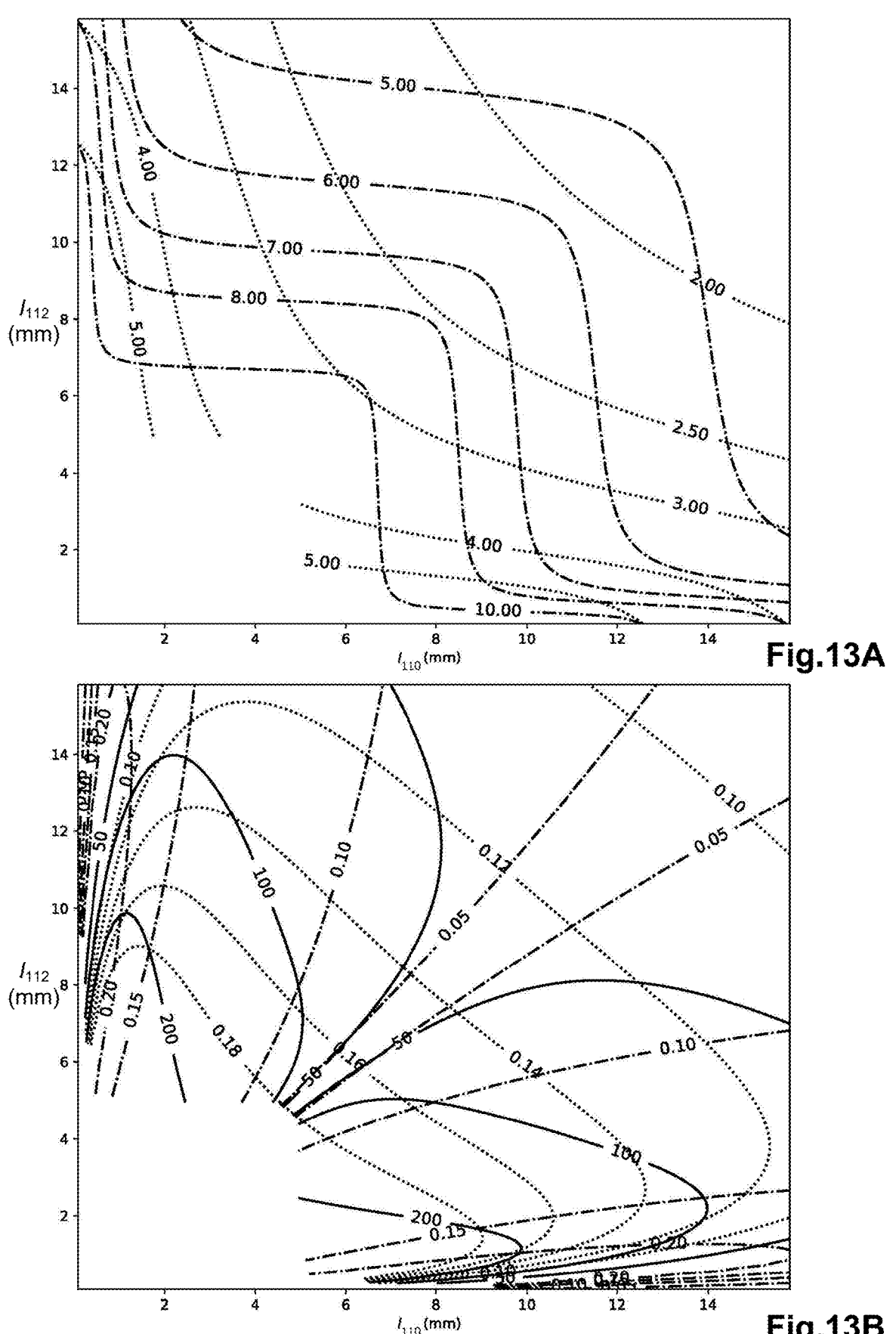
FIGS. 13A and 13B show diagrams illustrating values of $\varphi$ and f for respectively the first mode and the second mode of the superconducting quantum circuit of FIG. 10, along with corresponding $g_2/\varphi_p$ values.

The embodiment of FIG. 10 is similar to that of FIG. 9. There is again an open-ended transmission line, which carries both the first mode and the second mode, but the ATS 34 is put in series with two portions 110 and 112 of the transmission line. FIGS. 13A and 13B is the equivalent of FIG. 8, but for the embodiment of FIG. 10. For simplicity's sake, it will not be described further.

The invention claimed is:

1. An on-linear superconducting quantum circuit, comprising:

a first resonant portion comprising at least one inductance and at least one capacitor;

a second resonant portion comprising at least one inductance and at least one capacitor; and an asymmetrical threaded superconducting quantum interference device being arranged between said first resonant portion and said second resonant portion, wherein said non-linear superconducting quantum circuit being characterized in that said asymmetrical threaded superconducting quantum interference device is connected to both said first resonant portion and said second resonant portion galvanically, said non-linear superconducting circuit hosts a first mode (a) with a first resonant frequency in said first resonant portion and hosts a second mode (b) with a second resonant frequency in said second resonant portion, the ratio between said first resonant frequency and said second resonant frequency is different from $\frac{1}{2}$, said first resonant portion and said second resonant portion are configured with inductance and capacitance values which induce with said asymmetrical threaded superconducting quantum interference device said first mode (a) and said second mode (b) such that said non-linear superconducting quantum circuit has zero-point fluctuations of the superconducting phase across the asymmetrical threaded superconducting quantum interference device for the first mode (a) and the second mode (b) which are superior or equal to 0.05 rad.

2. The non-linear superconducting quantum circuit according to claim 1, wherein said at least one inductance and said at least one capacitor of said first resonant portion and said second resonant portion are in series or in parallel, respectively, and said asymmetrical threaded superconducting quantum interference device is in parallel or in series, respectively, with said first resonant portion and said second resonant portion.

3. The non-linear superconducting quantum circuit according to claim 2, wherein said non-linear superconducting quantum circuit lies on a dielectric substrate and is delimited from a common ground plane by exposed portions of said dielectric substrate, and said first resonant portion and said second resonant portion are realized in physically distinct portions of said non-linear superconducting quantum circuit.

4. The non-linear superconducting quantum circuit according to claim 1, wherein said non-linear superconducting quantum circuit lies on a dielectric substrate and is delimited from a common ground plane by exposed portions of said dielectric substrate, and said first resonant portion and said second resonant portion are realized in physically distinct portions of said non-linear superconducting quantum circuit.

5. The non-linear superconducting quantum circuit according to claim 4, wherein said non-linear superconducting quantum circuit is formed on a substantially planar substrate and has a width and a height which are shorter than a quarter wavelength corresponding respectively to said first resonant frequency and said second resonant frequency.

6. The non-linear superconducting quantum circuit according to claim 5, wherein said first resonant portion and said second resonant portion are galvanically isolated from said common ground plane.

7. The non-linear superconducting quantum circuit according to claim 5, wherein said first resonant portion and said second resonant portion are galvanically connected to said common ground plane.

8. The non-linear superconducting quantum circuit according to claim 4, wherein said first resonant portion and said second resonant portion are galvanically isolated from said common ground plane.

9. The non-linear superconducting quantum circuit according to claim 4, wherein said first resonant portion and said second resonant portion are galvanically connected to said common ground plane.

10. The non-linear superconducting quantum circuit according to claim 1, wherein the first resonant frequency and the second resonant frequency are such that a difference between two times the first resonant frequency and the second resonant frequency is smaller than half the first resonant frequency and half the second resonant frequency.

11. The non-linear superconducting quantum circuit according to claim 1, wherein one or more of said at least one inductance is made by an array of Josephson junctions or a high kinetic inductance material.

12. A quantum device comprising:
a non-linear superconducting quantum circuit, comprising:
  a first resonant portion comprising at least one inductance and at least one capacitor;
  a second resonant portion comprising at least one inductance and at least one capacitor; and
  an asymmetrical threaded superconducting quantum interference device being arranged between said first resonant portion and said second resonant portion,
wherein said non-linear superconducting quantum circuit being characterized in that said asymmetrical threaded superconducting quantum interference device is connected to both said first resonant portion and said second resonant portion galvanically, said non-linear superconducting circuit hosts a first mode (a) with a first resonant frequency in said first resonant portion and hosts a second mode (b) with a second resonant frequency in said second resonant portion, the ratio between said first resonant frequency and said second resonant frequency is different from ½, said first resonant portion and said second resonant portion-are configured with inductance and capacitance values which induce with said asymmetrical threaded superconducting quantum interference device said first mode (a) and said second mode (b) such that said non-linear superconducting quantum circuit has zero-point fluctuations of the superconducting phase across the asymmetrical threaded superconducting quantum interference device for the first mode (a) and the second mode (b) which are superior or equal to 0.05 rad;
a first microwave source connected to said non-linear superconducting quantum circuit for providing a radiation having a frequency equal to said second resonant frequency;
a second microwave source connected to said non-linear superconducting quantum circuit for providing a radiation having a frequency equal to the difference between two times the first resonant frequency and the second resonant frequency; and
a load to said at least one resonant portion which substantially only the second mode (b) is coupled, said first mode (a) thereby hosting a cat qubit.

13. The quantum device according to claim 12, further comprising a microwave filter for coupling to said load, said microwave filter being arranged to let the second resonant frequency pass and to block the first resonant frequency.

14. A quantum computing system, comprising:
at least one quantum device, wherein the at least one quantum device comprises:
  a non-linear superconducting quantum circuit, comprising:
    a first resonant portion comprising at least one inductance and at least one capacitor;
    a second resonant portion comprising at least one inductance and at least one capacitor; and
    an asymmetrical threaded superconducting quantum interference device being arranged between said first resonant portion and said second resonant portion,
  wherein said non-linear superconducting quantum circuit being characterized in that said asymmetrical threaded superconducting quantum interference device is connected to both said first resonant portion and said second resonant portion galvanically, said non-linear superconducting circuit hosts a first mode (a) with a first resonant frequency in said first resonant portion and hosts a second mode (b) with a second resonant frequency in said second resonant portion, the ratio between said first resonant frequency and said second resonant frequency is different from ½, said first resonant portion and said second resonant portion-are configured with inductance and capacitance values which induce with said asymmetrical threaded superconducting quantum interference device said first mode (a) and said second mode (b) such that said non-linear superconducting quantum circuit has zero-point fluctuations of the superconducting phase across the asymmetrical threaded superconducting quantum interference device for the first mode (a) and the second mode (b) which are superior or equal to 0.05 rad;

a first microwave source connected to said non-linear superconducting quantum circuit for providing a radiation having a frequency equal to said second resonant frequency;

a second microwave source connected to said non-linear superconducting quantum circuit for providing a radiation having a frequency equal to the difference between two times the first resonant frequency and the second resonant frequency; and a load to said at least one resonant portion which substantially only the second mode (b) is coupled, said first mode (a) thereby hosting a cat qubit.

15. The quantum computing system according to claim 14, wherein the at least one quantum device further comprises a microwave filter for coupling to said load, said microwave filter being arranged to let the second resonant frequency pass and to block the first resonant frequency.

* * * * *